US008472696B2

(12) United States Patent
Konishi et al.

(10) Patent No.: US 8,472,696 B2
(45) Date of Patent: Jun. 25, 2013

(54) OBSERVATION CONDITION DETERMINATION SUPPORT DEVICE AND OBSERVATION CONDITION DETERMINATION SUPPORT METHOD

(75) Inventors: Junko Konishi, Hitachinaka (JP); Tomohiro Funakoshi, Hitachinaka (JP); Tsunehiro Sakai, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 159 days.

(21) Appl. No.: 13/131,759

(22) PCT Filed: Nov. 19, 2009

(86) PCT No.: PCT/JP2009/069607
§ 371 (c)(1),
(2), (4) Date: Aug. 17, 2011

(87) PCT Pub. No.: WO2010/061771
PCT Pub. Date: Jun. 3, 2010

(65) Prior Publication Data
US 2011/0311125 A1 Dec. 22, 2011

(30) Foreign Application Priority Data

Nov. 28, 2008 (JP) ................................. 2008-303674

(51) Int. Cl.
*G06K 9/62* (2006.01)
(52) U.S. Cl.
USPC ......................................................... 382/149
(58) Field of Classification Search
None
See application file for complete search history.

(56) References Cited

U.S. PATENT DOCUMENTS

| 7,113,628 | B1 | 9/2006 | Obara et al. | |
|---|---|---|---|---|
| 7,570,797 | B1* | 8/2009 | Wang et al. | 382/145 |
| 2001/0048761 | A1* | 12/2001 | Hamamatsu et al. | 382/149 |
| 2003/0118149 | A1 | 6/2003 | Okuda et al. | |
| 2004/0228515 | A1* | 11/2004 | Okabe et al. | 382/145 |
| 2006/0028190 | A1 | 2/2006 | Balakrishnan et al. | |
| 2007/0047800 | A1* | 3/2007 | Hiroi et al. | 382/149 |
| 2008/0279444 | A1* | 11/2008 | Fischer et al. | 382/145 |

FOREIGN PATENT DOCUMENTS

| JP | 2001-156135 | 6/2001 |
|---|---|---|
| JP | 2003-107022 | 4/2003 |
| JP | 2006-351636 | 12/2006 |
| JP | 2007-040910 | 2/2007 |
| JP | 2007-184565 | 7/2007 |

* cited by examiner

*Primary Examiner* — Brian P Werner
(74) *Attorney, Agent, or Firm* — McDermott Will & Emery LLP

(57) ABSTRACT

Provided is an observation condition determination support device which can improve the defect classification accuracy. The observation condition determination support device includes: a means (26) for acquiring a plurality of defects images which have captured the same defect under a plurality of observation conditions set in advance in an observation device (5) in accordance with check data relating to defects of a semiconductor device detected by an inspection device (4); a means (12) for classifying the plurality of the same defects according to the respective defect images and determining a first category to which the same defects belong for each of the observation conditions as a result of the classification; and a means (13) for determining an observation condition to be used when fabricating the semiconductor device among the plurality of the observation conditions according to the ratio at which the first category is matched with a second category determined by a user of the observation device who has classified the same defects.

16 Claims, 8 Drawing Sheets

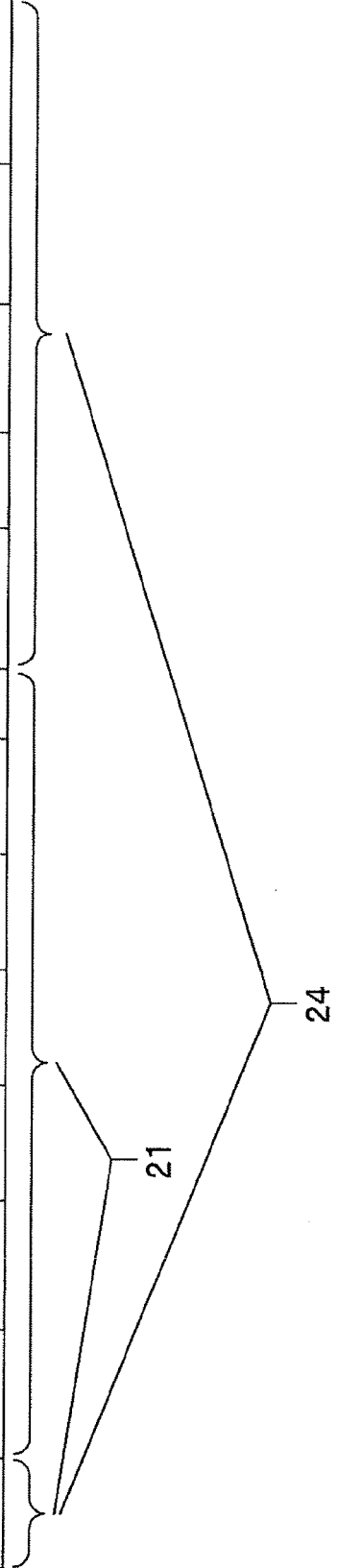

| Condition item | Condition 1 | Condition 2 | ... |
|---|---|---|---|
| Item 1 (Acceleration voltage) | | | |
| Item 2 (Number of image accumulation) | | | |
| Item 3 | | | |
| ⋮ | | | |

| Defect ID | Visual classification information | Detailed observation condition 1 | | Detailed observation condition 2 | | Detailed observation condition 3 | |
|---|---|---|---|---|---|---|---|
| | | Defect image | Classification result | Defect image | Classification result | Defect image | Classification result |
| ID-1 | Category 1 | | Category 1 | | Category 1 | | Category 3 |
| ID-2 | Category 2 | | Category 1 | | Category 2 | | Category 2 |
| ID-4 | Category 1 | | Category 1 | | Category 1 | | Category 3 |
| ID-5 | Category 2 | | Category 2 | | Category 3 | | Category 3 |
| ⋮ | ⋮ | | ⋮ | | ⋮ | | ⋮ |

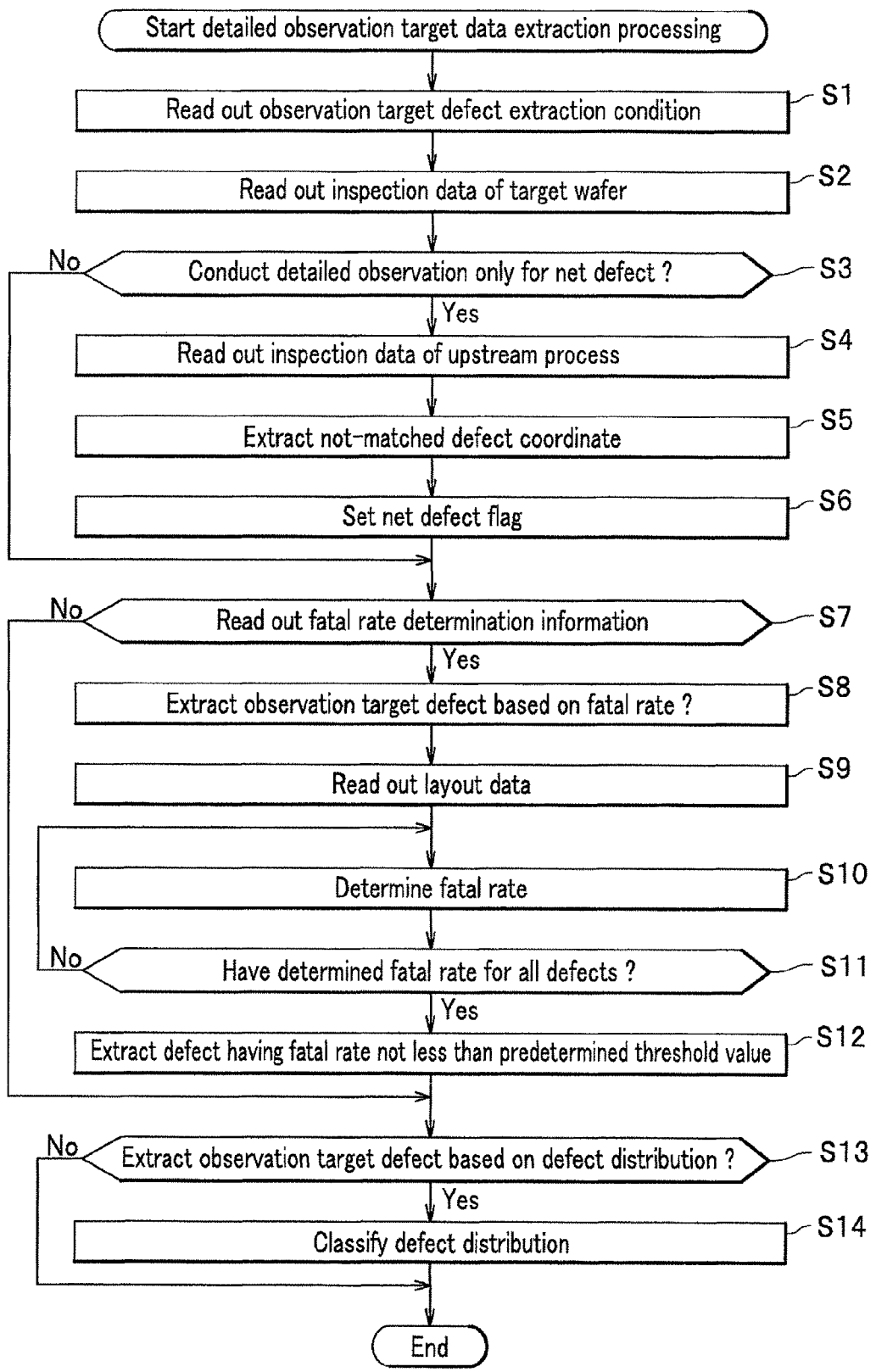

OBSERVATION CONDITION DETERMINATION SUPPORT DEVICE AND OBSERVATION CONDITION DETERMINATION SUPPORT METHOD

RELATED APPLICATIONS

This application is the U.S. National Phase under 35 U.S.C. §371 of International Application No. PCT/JP2009/069607, filed on Nov. 19, 2009, which in turn claims the benefit of Japanese Application No. 2008-303674, filed on Nov. 28, 2008, the disclosures of which Applications are incorporated by reference herein.

TECHNICAL FIELD

The present invention relates to an observation condition determination support device and observation condition determination support method that determine an observation condition for photographing a defect and acquiring a defect image by a detailed observation device, based on an inspection data relating to the defect of a semiconductor device detected by an inspection device.

BACKGROUND ART

In a fabrication process of a semiconductor device, a defect on a wafer such as a foreign substance may cause a defective product. Therefore, in order to improve yield of the product, it is preferable to take countermeasures which detect the defect during the fabrication process of the semiconductor device, which immediately identify a defect origin, and which do not generate the same defect in the semiconductor device that is fabricated successively.

An inspection device is used for detecting the defect. In addition, a detailed observation device is used for identifying the defect origin, and the detected defect is photographed under magnification by the detailed observation device in order to generate a defect image. A user identifies the defect origin by observing a shape of the photographed defect.

Hence, in order to improve efficiency for photographing and observing the defect as well as identifying the defect origin in the detailed observation device, technologies of ADR (Automatic Defect Review) and ADC (Automatic Defect Classification) have been proposed. In the ADR, a defect image can be automatically photographed using an image processing technology. In the ADC, a classification of, for example, a type of defect such as a disconnection and a short circuit, and further the classification whether or not the defect exists in an under layer, can be automatically conducted (see, for example, Patent Documents 1 and 2).

PRIOR ART DOCUMENT

Patent Document

[Patent Document 1] Japanese Patent Publication No. 2007-40910
[Patent Document 2] Japanese Patent Publication No. 2007-184565

SUMMARY OF THE INVENTION

Problems to be Solved by the Invention

In the detailed observation device utilizing a conventional automatic defect review and automatic defect classification, a result of the automatic defect classification may be different from the classification result by a user of the detailed observation device in some cases, and this has been the problem for improving the defect classification accuracy.

Therefore, in order to solve the foregoing problem, it is an object of the present invention to provide an observation condition determination support device and observation condition determination support method that are capable of improving the defect classification accuracy.

Means for Solving the Problems

According to the present invention that solved the foregoing problem, there is provided an observation condition determination support device that: acquires a plurality of defect images of a same defect photographed under a plurality of observation conditions set in advance in an observation device, based on an inspection data of the same defect of a semiconductor device detected by an inspection device; determines a first category to which the same defect belongs for each of the plurality of the observation conditions as a result of classification, by classifying a plurality of the same defects based on each of the defect images; and determines the observation condition to be used when the semiconductor device is fabricated from the plurality of the observation conditions, based on a rate that the first category is matched with a second category which is determined by a user of the observation device by classifying the same defect.

Effects of the Invention

According to the present invention, an observation condition determination support device and observation condition determination support method that are capable of improving the defect classification accuracy can be provided.

BRIEF DESCRIPTION OF THE DRAWINGS

FIG. 2 is a data structure diagram of an inspection date DB and detailed observation target data DB;

FIG. 3 is a data structure diagram of a detailed observation condition DB;

FIG. 4 is a data structure diagram of a detailed observation result summary data DB;

FIG. 5 is a flowchart of a detailed observation target data extraction processing in an observation condition determination support method according to the embodiment of the present invention;

EMBODIMENT OF THE INVENTION

Next, explanation for the embodiment of the present invention will be given in detail by reference to drawings as appropriate. Meanwhile, a common element in each of the drawings is given the same reference number, and a duplicated explanation will be omitted.

Figure 1A:
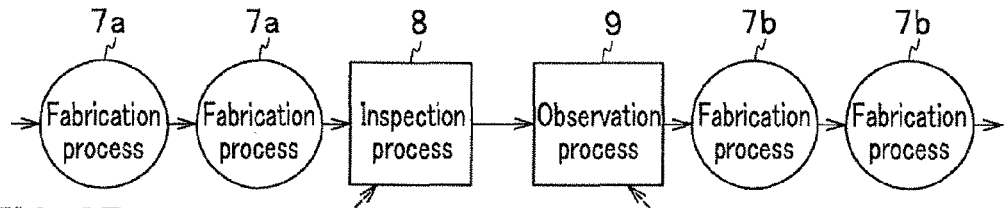
FIG. 1A is a flowchart of a fabrication flow of a semiconductor device.
Figure 1B:
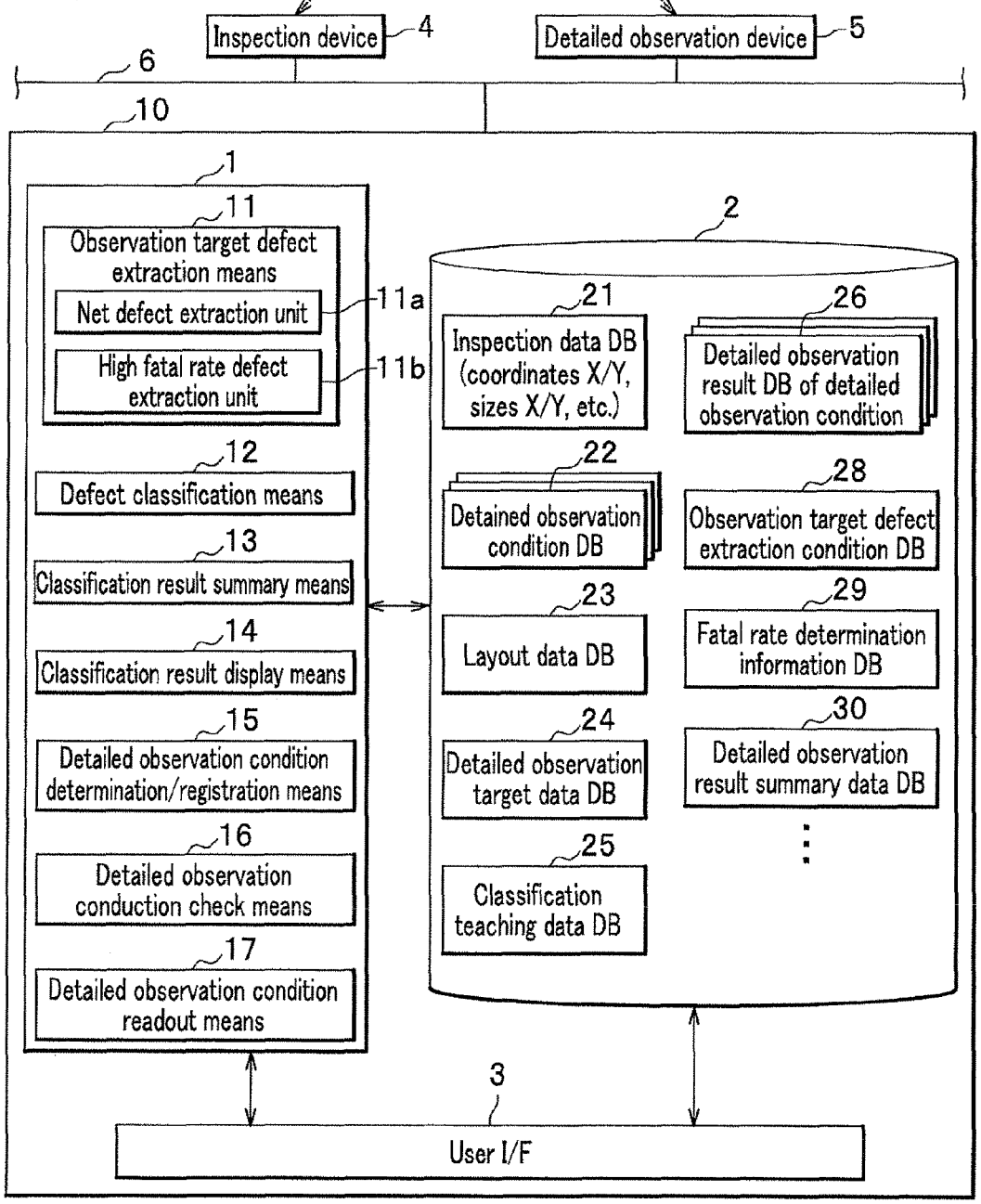
FIG. 1B is a configuration diagram of an observation condition determination support device according to an embodiment of the present invention.

A flowchart of a fabrication flow of a semiconductor device is shown in FIG. 1A, and a configuration of an observation condition determination support device 10 according to the embodiment of the present invention and an inspection device 4 as well as a detailed observation device 5, which are is connected to the observation condition determination support device 10, are shown in FIG. 1B.

As shown in FIG. 1A, a semiconductor device is fabricated by a plurality of fabrication processes 7a, and through the fabrication processes 7a, reaches an inspection process 8. The inspection process 8 is conducted using the inspection device 4. In the inspection process 8, a defect of the semiconductor device is detected and an inspection date is generated. Next, the semiconductor device is sent to a detailed observation process 9. The detailed observation process 9 is conducted using the detailed observation device 5. In the detailed observation process 9, a defect detected in the inspection process 8 is photographed under the observation condition (photographing condition) determined in advance based on the inspection data, and a defect image is generated. Then, the defect is classified into categories based on the defect image and identified whether or not the defect causes a fatal effect on the product, while identifying a defect origin. If the defect does not cause the fatal effect on the product, the semiconductor device is continuously processed in the following fabrication processes 7b. In the fabrication processes 7a, 7b, processes such as a film formation, a lithographic exposure and etching are conducted repeatedly. The fabrication processes 7a, 7b include hundreds of processes, and the semiconductor device can be completed by processing through the fabrication processes. Although only one cycle is shown in FIG. 1A, the inspection process 8 and detailed observation process 9 are conducted plural times during the hundreds of fabrication processes.

In the fabrication of a semiconductor device, first, a fabrication flow including the hundreds of fabrication processes, where the inspection process 8 and detailed observation process 9 are included, is determined. Then, as a trial production, the semiconductor device is fabricated according to the fabrication flow. In the trial production, fabrication conditions of the film formation, lithographic exposure and etching in the fabrication processes 7a, 7b are adjusted so that defects detected in the inspection process 8 can be reduced. In addition, in the trail production, the defects detected in the inspection process 8 are photographed, and an observation condition (photographing condition) for observing the semiconductor device is determined so that the defects can be classified into categories based on the photographed defect images. If the observation condition (photographing condition) is appropriate, and if a defect which lowers the yield can be photographed certainly under a correct observation condition (photographing condition) and the defect can be classified into predetermined categories, the defect origin may be easily identified and the yield may also be increased, and as a result, a number of trial production can be reduced. Thus, a production of a semiconductor device moves to a mass production through a trial production. In the mass production, the semiconductor device is fabricated by the fabrication conditions determined by the trial production. If a number of defects increase in the inspection process 8, the defects are photographed under the observation condition (photographing condition) and classified into the categories, which were determined by the trial production. As a result, the defect origin can be easily identified and the yield of the semiconductor device can be maintained high. As described above, a prompt determination of an appropriate observation condition (photographing condition) is very important. In addition, in the mass production, an unexpected defect may be generated in some cases. The unexpected defect is also detected in the inspection process 8. However, in some cases, the unexpected defect may not be certainly photographed and may not be classified into the predetermined categories by the detailed observation device 5. In this case, if a new observation condition (photographing condition) is promptly determined and if the new defect can be certainly photographed and classified into newly set categories, an origin of the new defect can be easily identified. As described, in the production of a semiconductor device, it is important to determine the observation condition (photographing condition) promptly and correctly in the detailed observation process 9.

According to the observation condition determination support device 10, the observation condition (photographing condition) can be promptly and correctly determined. As shown in FIG. 1B, the observation condition determination support device 10 is connected to the inspection device 4 and detailed observation device 5 via a communication line 6. The observation condition determination support device 10 includes a processing means 1 for executing each processing, a storage means 2 for storing an input/output data of the each processing and a user I/F 3 for displaying a result of the each processing as well as requiring a user to input a condition of the each processing. In addition, although not shown, the observation condition determination support device 10 includes a network I/F for connecting with the communication line 6. Meanwhile, from hardware point of view, the processing means 1 corresponds to CPU and RAM of a computer, and the storage means 2 corresponds to RAM and HD of the computer.

The processing means 1 includes an observation target defect extraction means 11, a defect classification means 12, a classification result summary means 13, a classification result display means 14, a detailed observation condition determination/registration means 15, a detailed observation conduction check means 16 and a detailed observation condition readout means 17.

The observation target defect extraction means 11 includes a net defect extraction unit 11a and a high fatal rate defect extraction unit 11b. The observation target defect extraction means 11 extracts a defect (observation target defect) to be photographed/classified (observation) by the detailed observation device 5 from defects detected by the inspection device 4. The net defect extraction unit 11a extracts only defects of net (net defect) which are generated in the fabrication processes between the previous inspection process 8 and the current inspection process 8. The high fatal rate defect extraction unit 11b determines a fatal rate which is a rate that a semiconductor device becomes a defective product, based on a layout data of the semiconductor device and position information of a defect detected by the inspection device 4 on a wafer as well as on a chip, and extracts the defect having a high fatal rate not less than a threshold value as an observation target defect. According to this, a number of defects to be photographed/classified can be reduced, and a more time can be allocated for photographing/classifying each of the defects, thereby resulting in improvement of the defect classification accuracy.

Based on an inspection data relating to defects (and in addition, observation target defects) of a semiconductor device detected by the inspection device 4, the defect classification means 12 acquires a plurality of defect images of the same defect photographed under a plurality of observation conditions set in advance in the detailed observation device 5. In addition, based on each of the defect images, the defect classification means 12 classifies a plurality of the same defects, and determines a first category to which the same defect belongs for each observation condition, as a result of the classification. Meanwhile, in the detailed observation device 5, a defect image of a defect photographed under one observation condition, which is set in advance, is generated, and based on the defect image, the defect can be classified and the first category to which the defect belongs can be determined. Therefore, the defect classification means 12 supports the detailed observation device 5, which can photograph under only a single observation condition, so that the detailed observation device 5 can photograph the same defect under a plurality of observation conditions. Then, it becomes possible to compare the plurality of the observation conditions to each other. Here, the first category is a category which can be identified by a defect image, specifically, such as a category to which a circular defect belongs, a category to which a defect having a projection at a periphery belongs and a category to which an angular defect belongs.

The classification result summary means 13 instructs to summarize (store) the second category that is determined by a user of the detailed observation device 5 by classifying the same defects and the first category for each observation condition, for each of the same defects. The classification result summary means 13 calculates a rate (matching rate) that the first category is matched with the second category for each observation condition, and based on the matching rate, the observation condition to be used for the fabrication of the semiconductor device is determined from the plurality of the observation conditions. According to this, an observation condition that is the closest to a defect classification tendency of the user can be selected, and the defect classification tendency of the user can be reflected on the observation condition. Namely, a correct observation condition can be determined. In addition, since the observation condition can be determined by a numerical value of the matching rate, the observation condition can be determined promptly. Here, the second category is a category which can be identified by a defect image, specifically, such as a category to which a circular defect belongs, a category to which a defect having a projection at a periphery belongs and a category to which an angular defect belongs, as with the first category.

The classification result display means 14 displays a list of the second category and a plurality of the first categories corresponding to the plurality of the observation conditions, for each of the same defects. In addition, the classification result display means 14 displays a list of a plurality of defect images of the same defect photographed under the plurality of the observation conditions, for each of the same defects. Furthermore, the classification result display means 14 displays the list of the plurality of defect images of the same defect photographed under the plurality of the observation conditions, and requires the user to determine and input the second category after reviewing the display of the list. According to this procedure, the user can easily determine and set the second category.

In addition, if the classification result summary means 13 extracts a defect whose first category is not matched with the second category, the classification result display means 14 displays defect images of defects in the category identical to the first category of the extracted defect and defect images of defects in the category identical to the second category of the extracted defect together, and requires to input a change of the first category or the second category. According to this, the observation condition can be brought close to a defect classification tendency of the user, and in addition, conversely, the defect classification tendency of the user may be corrected.

The detailed observation condition determination/registration means 15 registers (stores) the determined observation condition in the storage means 2 in such a manner that the observation condition corresponds to a semiconductor device to which the detailed observation according to the observation condition is applied.

The detailed observation conduction check means 16 determines whether or not a number of defects detected by the inspection device 4 currently tends to increase with time in the same semiconductor device, or whether or not the number of defects detected by the inspection device 4 exceeds a predetermined threshold value, especially in the mass production. If it is determined that the number of defects tends to increase, or that the number of defects exceeds the predetermined threshold value, the detailed observation conduction check means 16 instructs the detailed observation device 5 to conduct the detailed observation process 9 for the semiconductor device currently being inspected by the inspection device 4. On the other hand, if determined that the number of defects does not tend to increase, or that the number of defects does not exceed the predetermined threshold value, the detailed observation conduction check means 16 instructs the semiconductor device currently being inspected by the inspection device 4 to skip the detailed observation process 9 and conduct the next fabrication processes 7b.

If the detailed observation conduction check means 16 determined that the number of defects detected by the inspection device 4 tends to increase, or that the number of defects detected by the inspection device 4 exceeds a predetermined threshold value, the detailed observation condition readout means 17 reads out an inspection condition corresponding to the semiconductor device currently being inspected. The read out inspection condition is transmitted to the detailed observation device 5, and a detailed observation of the semiconductor device is conducted under the inspection condition.

The storage means 2 includes an inspection data DB (database) 21, a detailed observation condition DB 22, a layout data DB 23, a detailed observation target data DB 24, a classification teaching data DB 25, a detailed observation result DB 26 of detailed observation condition, an observation target defect extraction condition DB 28, a fatal rate determination information DB 29 and a detailed observation result summary data DB 30.

The inspection data DB 21 receives an inspection data of defects detected by the inspection device 4 from the inspection device 4 and stores the inspection data. The inspection data contains, for example, a coordinate X and coordinate Y of a defect on a wafer and a chip, and sizes of the defect in X direction (size X) and Y direction (size Y).

The detailed observation condition DB 22 stores contents of "observation condition 1", "observation condition 2", "observation condition 3" and the like. In the detailed observation condition DB 22, a plurality of observation conditions are set (stored) in advance.

In the layout data DB 23, a layout data of a semiconductor device is stored. Meanwhile, the layout data DB 23 may be an external device of the observation condition determination support device 10, while connected by the communication line 6.

In the detailed observation target data DB 24, identification information for identifying an observation target defect extracted by the observation target defect extraction means 11 from other defects is stored.

In the classification teaching data DB 25, a classification teaching data to be used for classification by the defect classification means 12 is stored.

In the detailed observation result DB 26 of the detailed observation condition, defect images photographed under a detailed observation such as "observation condition 1", "observation condition 2" and "observation condition 3" are stored.

In the observation target defect extraction condition DB 28, an observation target defect extraction condition that is used by the observation target defect extraction means 11 when extracting an observation target defect is stored.

In the fatal rate determination information DB 29, fatal rate determination information that is used by the high fatal rate defect extraction unit 11b when determining the fatal rate is stored.

In the detailed observation result summary data DB 30, the second category that is determined by a user and the first category for each of a plurality of observation conditions are stored, for each of the same defects, using the classification result summary means 13.

A data structure diagram of the inspection date DB 21 and the detailed observation target data DB 24 is shown in FIG. 2. The inspection date DB 21 includes, for each defect detected by the inspection device 4, a field (item) 201 storing a defect ID of the defect, a field 202 storing a coordinate X of the defect within a wafer, a field 203 storing a coordinate Y of the defect within the wafer, a field 204 storing a coordinate X of the defect within a chip, a field 205 storing a coordinate Y of the defect within the chip, a field 206 storing a defect size X of the defect in X direction and a field 207 storing a defect size Y of the defect in Y direction.

The detailed observation target data DB 24 includes, for each defect detected by the inspection device 4, the field 201 storing the defect ID of the defect, a field 208 storing a net defect flag identifying whether or not the defect is a net defect, a field 209 storing a rate (fatal rate) at which a semiconductor device becomes a defective product by the defect, a field 210 storing an order (order of selection) of priority that the defect is selected as an observation target defect, a field 211 storing an observation target defect flag identifying whether or net the defect is the observation target defect and a field 212 storing a plurality of observation conditions to be used for observing (photographing/classifying) the defect in detail.

A data structure diagram of the detailed observation condition DB 22 is shown in FIG. 3. The detailed observation condition DB 22 includes a field 301 storing a condition item of an observation condition used in the detailed observation device 5, a field 302 storing a numerical value of "observation condition 1" for each condition item and a filed 303 storing a numerical value of "observation condition 2" for the each condition item. Meanwhile, as a condition item, when a charged particle beam such as an electron beam is used for photographing a defect in the detailed observation device 5, for example, an acceleration voltage of charged particles and an accumulation times (a number of image accumulation) of an image which is imaged by scanning the charged particles may be adopted.

A data structure diagram of the detailed observation result summary data DB 30 is shown in FIG. 4. The detailed observation result summary data DB 30 includes, for each observation target defect, a field 401 storing a defect ID of the observation target defect, a field 402 storing a category (visual classification information) that is classified by a user by visually classifying the observation target defects, a field 403 storing a defect image of the observation target defect photographed in the detailed observation (photographing/classifying) using "detailed observation condition 1" ("observation condition 1"), a field 404 storing a category (classification result) that is classified by the detailed observation device 5 (or defect classification means 12) by classifying the observation target defects in the detailed observation (photographing/classifying) using the "detailed observation condition 1" ("observation condition 1"), a field 405 storing a defect image of the observation target defect photographed in the detailed observation (photographing/classifying) using "detailed observation condition 2" ("observation condition 2"), a field 406 storing a category (classification result) that is classified by the detailed observation device 5 (or defect classification means 12) by classifying the observation target defects, a field 407 storing a defect image of the observation target defect photographed in the detailed observation (photographing/classifying) using "detailed observation condition 3" ("observation condition 3") and a field 408 storing a category (classification result) that is classified by the detailed observation device 5 (or defect classification means 12) by classifying the observation target defects.

A flowchart of a detailed observation target data (observation target defect) extraction processing in the observation condition determination support method using the observation condition determination support device 10 according to the embodiment of the present invention is shown FIG. 5.

First, in step S1, the observation target defect extraction means 11 reads out an observation target defect extraction condition registered in advance from the observation target defect extraction condition DB 28. As one example of contents of the observation target defect extraction condition, a condition whether the following processing is executed or not is registered in advance. Namely, a fatal rate that is a rate at which a semiconductor device becomes defective is calculated based on processing that limits the observation target defect to only a net defect generated in the preceding fabrication process 7a and a layout data of the semiconductor device as well as position information of the defect, and the fatal rate which is not less than a predetermined threshold value is extracted.

Next, in step S2, the observation target defect extraction means 11 reads out an inspection data of a target wafer in the preceding inspection process 8 inspected in advance by the inspection device 4 from the inspection data DB 21.

In step S3, the observation target defect extraction means 11 checks whether or not there is an instruction in the read out observation target defect extraction condition to execute processing that limits the observation target defect to only the net defect. If there is the instruction (step S3: Yes), the processing proceeds to step S4, and if not (step S3: No), the processing proceeds to step S7.

In step S4, the net defect extraction unit 11a of the observation target defect extraction means 11 reads out an inspection data of upstream inspection processes 8 that are conducted before (in upstream) the preceding fabrication process of the target wafer. Meanwhile, the inspection data may be stored in the inspection device 4 that conducted the inspection, or may be stored in a server (not shown) connected to the inspection device 4 via the communication line 6. Then, the observation target defect extraction means 11 may read out the inspection data from the inspection device 4, or the server via the communication line 6.

In step S5, the net defect extraction unit 11a extracts a coordinate of a defect which is not matched with coordinates X, Y within a wafer and coordinates X, Y within a chip of the inspection data of the upstream inspection processes 8 from the coordinates X, Y within the wafer and coordinates X, Y within the chip of the inspection data of the preceding inspection process 8.

In step S6, the net defect extraction unit 11a sets a net defect flag to a defect (defect ID) corresponding to the extracted defect coordinate (coordinates X, Y within a wafer, coordinates X, Y within a chip) and writes the net defect flag in the field 208 of the detailed observation target DB 24.

In step S7, the observation target defect extraction means 11 checks whether or not there is an instruction in the read out observation target defect extraction condition to execute processing for extracting an observation target defect based on the fatal rate. If there is the instruction (step S7: Yes), the processing proceeds to step S8, and if not (step S7: No), the processing proceeds to step S13.

In step S8, the high fatal rate defect extraction unit 11b of the observation target defect extraction means 11 reads out fatal rate determination information that is capable of determining a fatal rate based on a positional relation between a layout pattern of a semiconductor device and a defect which are registered in advance in the layout data DB 23, from the fatal rate determination information DB 29. The fatal rate determination information is the information which is capable of determining the fatal rate based on the positional relation between the layout pattern and the defect, for example, in such a manner that the fatal rate is set to 80% for the positional relation that the defect adheres across a plurality of wiring patterns, and set to 5% for the positional relation that the defect adheres away from a wiring pattern.

In step S9, the high fatal rate defect extraction unit 11b reads out the layout data of the semiconductor device being fabricated on the target wafer from the layout data DB 23.

In step S10, when a net defect flag is set, the high fatal rate defect extraction unit 11b converts the position information (coordinates X, Y within wafer, coordinates X, Y within chip, defect sizes X, Y) of the defect, to which the net defect flag is set, to position coordinates on the layout pattern. Subsequently, the high fatal rate defect extraction unit 11b sets, for example, a rectangular shape and an ellipsoidal shape (correspond to circular shapes in FIG. 9) based on the position information of the defect which show defect existing areas 35-38 (see FIG. 9), on the position coordinates on the layout pattern (correspond to wiring pattern 32 in FIG. 9). The high fatal rate defect extraction unit 11b determines the fatal rate from the positional relation between the layout pattern and the defect existing area based on the fatal rate determination information, and writes the fatal rate to the defect ID corresponding to the defect coordinates in the field 209 of the detailed observation target data DB 24.

In step S11, the high fatal rate defect extraction unit 11b checks whether or not the fatal rate is determined for all defects that are required to determine the fatal rate. If the fatal rate is determined for the all defects (step S11: Yes), the processing proceeds to step S12, and if not (step S11: No), the processing returns to step S10.

In step S12, the high fatal rate defect extraction unit 11b extracts a defect (defect ID) having a fatal rate not less than a predetermined threshold value, sets an observation target defect flag to the extracted defect, and writes the observation target defect flag in the field 211 of the detailed to observation target data DB 24. Meanwhile, in the extraction of the defect, a predetermined number of defects may be extracted in descending order of the fatal rate instead of the threshold value. In this case, the high fatal rate defect extraction unit 11b writes a selection order of the defect in the descending order of the fatal rate in the field 210 of the detailed observation target data DB 24. The high fatal rate defect extraction unit 11b extracts a defect (defect ID) having a fatal rate larger than the predetermined threshold value, sets an observation target defect flag to the extracted defect, and writes the observation target defect flag in the field 211 of the detailed observation target data DB 24. As described above, in step S12, a defect having a fatal rate not less than the predetermined threshold value is processed.

In step S13, the observation target defect extraction means 11 checks whether or not there is an instruction in the read out observation target defect extraction condition to execute processing for extracting an observation target defect from defects classified from a distribution of the defects within a wafer. If there is the instruction (step S13: Yes), the processing proceeds to step S14, and if not (step S13: No), the detailed observation target data extraction processing is terminated. Meanwhile, when the detailed observation target data extraction processing is terminated, if a net defect flag is set and if an observation target defect flag is not set, the net defect flag is copied and pasted in the field 211 of the observation target defect flag as the observation target defect flag.

In step S14, the observation target defect extraction means 11 classifies defects into, for example, a repeated pattern defect and a cluster defect from a distribution of the defects within the wafer based on position information of the defects of the inspection data, and extracts a representative observation target defect from the classified defects. In addition, the observation target defect extraction means 11 sets an observation target defect flag (check) to the extracted defect and writes the observation target defect flag (check) in the field 211 of the detailed observation target data DB 24. Hence, a defect to be observed in detail can be selected (extracted), and the detailed observation target data extraction processing is terminated. From the foregoing description, a requirement for the defect to which an observation target defect flag (check) is set is summarized that the defect must satisfy at least one of the following defect conditions, namely, a net defect flag is set to the defect, a fatal rate of the defect is not less than a predetermined threshold value, or the defect represents, for example, a repeated pattern defect and a cluster defect that are classified from a distribution of the defects within a wafer.

Figure 6:
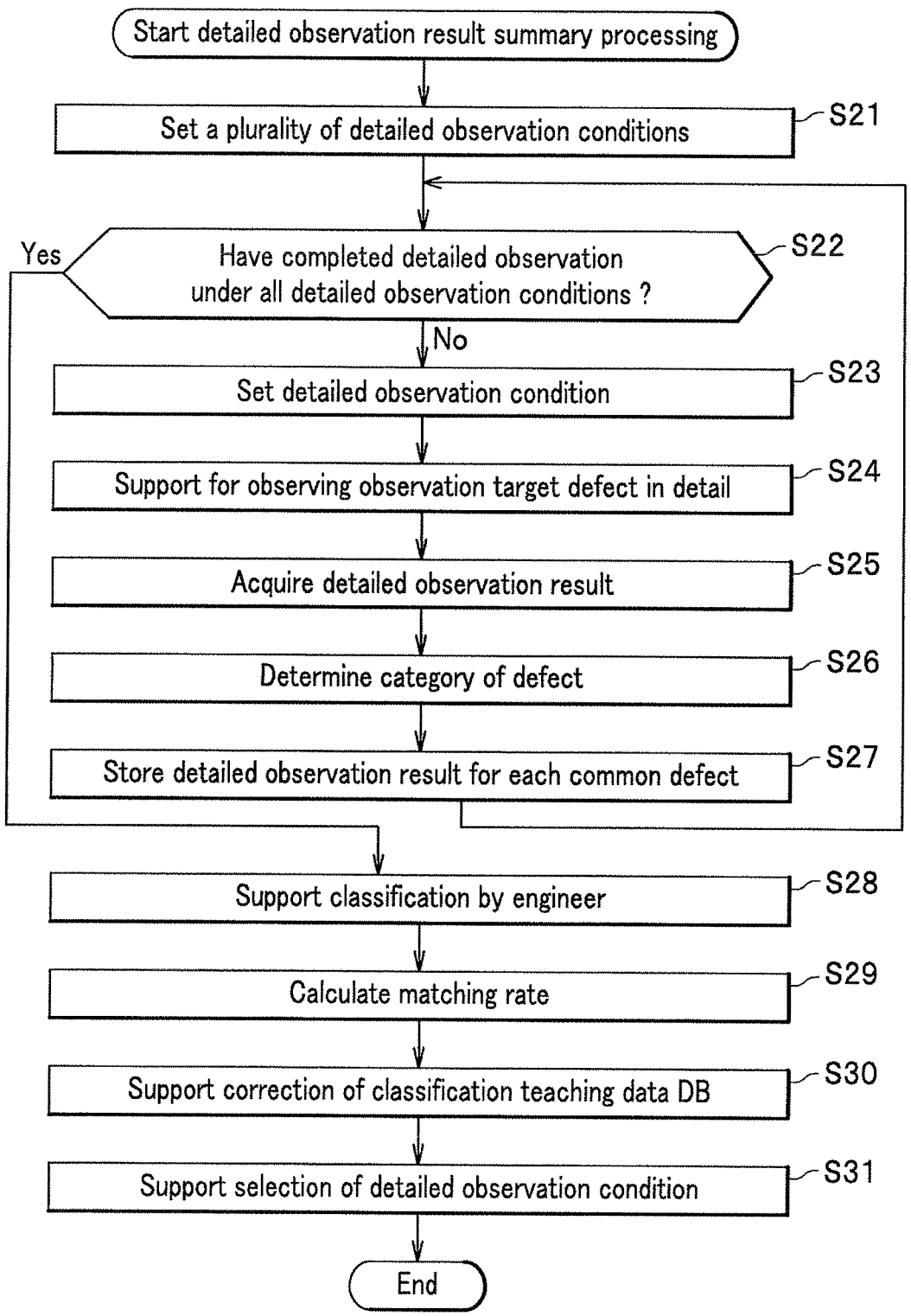
FIG. 6 is a flowchart of a detailed observation result summary processing in an observation condition determination support method according to the embodiment of the present invention.

A flowchart of a detailed observation result summary processing in an observation condition determination support method using the observation condition determination support device 10 according to the embodiment of the present invention is shown in FIG. 6.

In the detailed observation result summary processing, first, in step S21, the defect classification means 12 sets a plurality of detailed observation conditions (observation conditions) that are used when the detailed observation device 5 actually observes in detail, for the selected observation target defect, that is, for the defect to which the observation target defect flag (check) is set in the field 211, and writes the plurality of the observation conditions in the field 212 of the detailed observation target data DB 24. In the plurality of the detailed observation conditions, as shown in FIG. 3, a condition value for each condition item is set in advance and the condition value is written in the detailed observation condition DB 22.

Next, in step S22, the defect classification means 12 checks whether or not the detailed observation (photographing/classifying) is completed under all detailed observation conditions. If completed (step S22: Yes), the processing proceeds to step S28, and if not (step S22: No), the processing proceeds to step S23. Meanwhile, the step S22 is executed repeatedly. However, regarding the first time, since the detailed observation is not started yet even in the first detailed observation condition and the processing is not completed, the processing proceeds to step S23.

In step S23, the defect classification means 12 reads out a condition item of the detailed observation condition which is already set, but not read out from the detailed observation condition DB 22, and transmits the condition item to the detailed observation device 5 to set therein.

In step S24, the detailed observation device 5 conducts a detailed observation of a target wafer based on the detailed observation condition DB 22 which is written by the defect classification means 12. The defect classification means 12 reads out position information, which is used for the detailed observation, of inspection data of an observation target defect, by using the inspection data DB 21 and the detailed observation target data DB 24, and transmits the position information to the detailed observation device 5. By the support described above, the detailed observation device 5 can conduct only the detailed observation of the observation target defect.

In step S25, the detailed observation device 5 transmits the detailed observation result (correspond to defect image and category (correspond to the first category)) acquired by the detailed observation to, for example, the detailed observation result DB 26 of the detailed observation condition, and the detailed observation result DB 26 of the detailed observation condition acquires the detailed observation result to store therein. The detailed observation result is, specifically, a defect image of the observation target defect photographed by the detailed observation device 5 and a category of the classified defect. The defect image is not necessarily limited to one for a single observation target defect under a single observation condition, but may be plural defect image. When the defect image is plural, the defect may be photographed by changing an incident angle of electron beam to the defect, and the defect may be photographed, for example, from a vertical direction, or from an oblique direction. When the defect is photographed from the vertical direction, a net size (area) of the defect may be determined. In addition, when photographed from an oblique direction, a shadow of the electron beam may be photographed and thereby, a concave-convex shape of the defect may be determined from a positional relation between the defect and the shadow.

In step S26, the defect classification means 12 and the detailed observation device 5 execute defect classification processing for determining a category (correspond to the first category) to which a defect belongs using a defect image for each of the observation target defects, based on a classification teaching data stored in the classification teaching data DB 25. The defect classification means 12 stores the determined category in, for example, the detailed observation result DB 26 of the detailed observation condition so that the determined category corresponds to the defect corresponding to the category.

In step S27, the classification result summary means 13 sequentially registers the defect image and the category, each of which is corresponded to the same common defect (ID), in the detailed observation result summary data DB 30 for each detailed observation condition. Then, when the registration for all detailed observations conditions is completed, as shown in FIG. 4, the defect image and classification result (category) under a plurality of detailed observation conditions that are different to each other are summarized (stored) in the detailed observation result summary data DB 30, for each of the same common defects (ID), and the processing returns to step S22.

Figure 7:
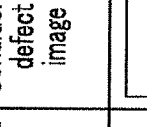
FIG. 7 is an illustration (First) showing one example of a user operation screen of a detailed observation result summary processing in an observation condition determination support method according to the embodiment of the present invention.

In step S28, the classification result summary means 13 supports an engineer (user) to classify the observation target defect into a category (correspond to the second category). The classification result summary means 13 displays a screen 710 as shown in FIG. 7 in a display screen of the user I/F 3, using the classification result display means 14. The classification result display means 14 displays a list of detailed observation result (condition 1 defect image, condition 2 defect image, condition 3 defect image, condition 1 classification category, condition 2 classification category, condition 3 classification category) of the same common observation target defect under a plurality of detailed observation conditions that are different to each other, for each defect ID, and displays "Please classify visually (for each defect)" in order to require the engineer to input a visual classification category. The engineer, while viewing the detailed observation result (defect image and category) under the plurality of the detailed observation conditions, and further, directly viewing the defect using the detailed observation device 5, can select a category as a visual classification category and can input the selected category via the user I/F 3. The classification result summary means 13 stores the input visual classification category in a field 402 of the detailed observation result summary data DB 30 so that the visual classification category corresponds to the defect ID corresponding to the visual classification category. Then, as shown in FIG. 7, the classification result summary means 13 displays a list of the visual classification category selected by the engineer and the defect image as well as the category under the plurality of the detailed observation conditions, for each defect ID of the same common observation target defects, using the classification result display means 14.

In step S29, the classification result summary means 13 calculates a matching rate for each detailed observation condition based on the detailed observation result summary data DB 30. The matching rate is a ratio of a number of defects whose, for example, condition 1 category that is determined by the defect classification means 12 is matched with the visual classification category that is selected by the engineer to the number of observation target defects. The calculated matching rate is displayed in a region 709 of the screen 710 so that the observation condition corresponding to the matching rate can be seen, using the classification result display means 14. Meanwhile, buttons 711-713 are tools for inputting an observation condition selected by the engineer from a keyboard (mouse) of the user I/F 3.

Figure 8:
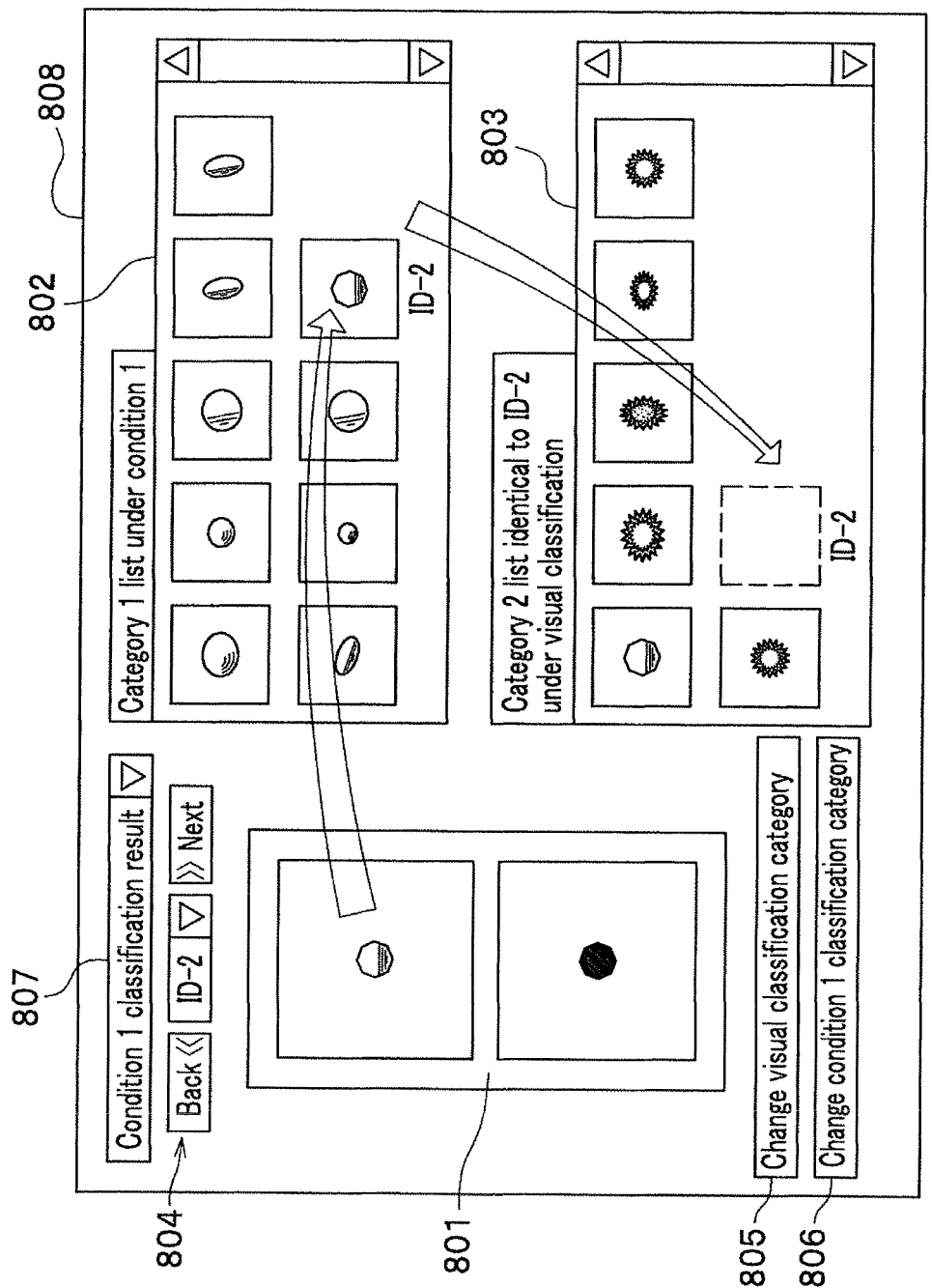
FIG. 8 is an illustration (Second) showing one example of a user operation screen of a detailed observation result summary processing in an observation condition determination support method according to the embodiment of the present invention.

In step S30, the classification result summary means 13 supports a correction of the classification teaching data DB 25. As the support, the classification result summary means 13 extracts, for example, a condition 1 classification category that is not matched with the visual classification category and a defect ID of the defect whose condition 1 classification category is not matched with the visual classification category. The classification result summary means 13 set a link displayed by an underline as shown in FIG. 7 to, for example, the condition 1 classification category that is not matched with the visual classifying category. With respect to a defect whose defect ID is ID-2, since the visual classification category is category 2 and the condition 1 classification category when the observation condition is condition 1 (observation condition 1) is category 1, the visual classification category of the defect whose defect ID is ID-2 is not matched with the condition 1 classification category. Therefore, category 1 of the condition 1 classification category is given an underline indicating that a link is set. Then, by clicking the category 1 which is given the underline by using, for example, a mouse of the user I/F 3, a linked screen 808 as shown in FIG. 8 can be displayed on a display screen of the user I/F 3.

An area 807 of the screen 808 is a list box, and an engineer can select an observation condition that the engineer wants to see from all observation conditions that were used for the observation.

An area 804 has, for example, a list box, and a defect ID of the defect to which, for example, a condition 1 classification category that is not matched with the visual classification category is set can be selected.

In an area 801, a defect image of the defect whose defect ID is ID-2 and which was photographed using the condition 1 (observation condition 1) to which the condition 1 classification category of the referrer belongs is displayed. In FIG. 8, a plurality (two) of defect images photographed by changing the irradiation direction of the electron beam are displayed.

In an area 802, a list (list table) of defect images of a plurality of observation target defects which are classified into category 1 when the plurality of the observation target defects are observed (photographed/classified) under the condition 1 (observation condition 1) is shown.

In an area 803, a list (list table) of defect images of a plurality of observation target defects whose visual classification category classified (visually classified) by the engineer is identical to category 2 that is the category of the defect whose defect ID is ID-2 is shown.

The engineer can easily decide whether the defect whose defect ID is ID-2 belongs to category 1, or category 2 by reviewing the two lists. If the engineer decides that the defect whose defect ID is ID-2 belongs to category 2, the engineer clicks a button 806 that changes the condition 1 classification category in order to change the condition 1 classification category from category 1 to category 2. By the clicking, the classification result summary means 13 changes the condition 1 classification category of the defect whose defect ID is ID-2 from category 1 to category 2, and also corrects the classification teaching data DB 25 so that the defect image of the defect whose defect ID is ID-2 can be classified into category 2. This change operation may be conducted by drag & drop.

On the other hand, if the engineer decides that the defect whose defect ID is ID-2 belongs to category 1, the engineer clicks a button 805 that changes the visual classification category in order to change the visual classification category from category 2 to category 1. By this clicking, the classification result summary means 13 changes the visual classification category of the defect whose defect ID is ID-2 from category 2 to category 1. According to this, the observation condition can be brought close to a defect classification tendency of the user, and conversely, the defect classification tendency of the user may also be corrected. It is preferable that the matching rate is calculated again after either correction, and displayed in the area 709 of the screen 710 again.

In step S31, the classification result summary means 13 displays "Please select detailed observation condition (observation condition) (Click the selected condition)" in the screen 710 of FIG. 7, using the classification result display means 14, and further, displays buttons 711-713 for inputting the selected detailed observation condition (observation condition) in order to require the engineer to select and input the detailed observation condition (observation condition). The classification result summary means 13 can support the engineer to easily select and input the observation condition, based on the level of the matching rate.

In the present embodiment, a plurality of observation conditions (photographing condition) of a defect are prepared, and a defect image as well as a category acquired under each observation condition and a category classified by an engineer are displayed together. As a result, a comprehensive evaluation of the classification result becomes possible. Then, comprehensive evaluations of a difference between defect images of the same defect photographed under different conditions and a difference between categories due to the difference between the defect images become possible, thereby an optimum photographing condition can be selected. In addition, it becomes possible to confirm/correct the category of the defect whose category is different between the category classified by the engineer and the category classified automatically by the detailed observation device 5. By displaying a plurality of defects belonging to the same category together, it becomes possible to compare common characteristics among the plurality of the defects, and thereby, the engineer can assign an optimum category based on understanding of the common characteristics.

In addition, it becomes possible to efficiently extract a fatal defect by superimposing a defect on the layout based on a layout data of the semiconductor device (chip) and coordinate data of the defect, and thereby, a classification focused on the defect of analysis target can be conducted. Furthermore, a past inspection data of a target wafer is stored, and by removing a defect detected on the target wafer in the past from the current inspection data, it becomes possible to conduct the detailed observation only for a newly detected defect. Since the analysis is conducted for the observation target defect narrowed down as described above, a fabrication process that causes an origin of defect generation can also be narrowed down. As a result, the origin of the defect generation can be identified.

Figure 9:
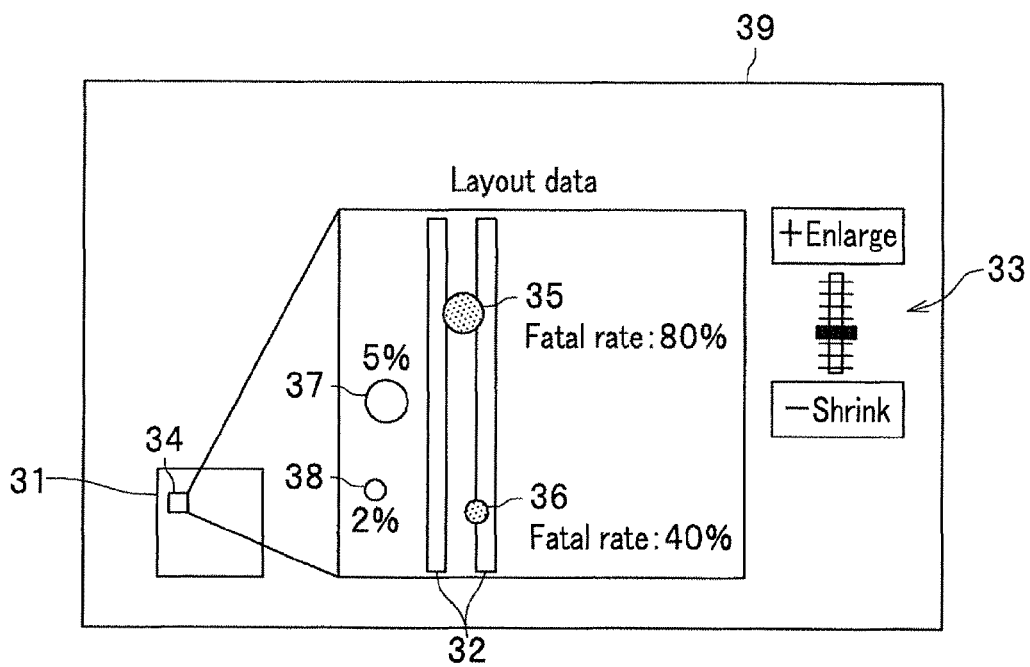
FIG. 9 is an illustration showing one example of a screen of a superimpose display of a layout data and an inspection data.

One example of a screen 39 of a superimpose display of a layout data and an inspection data is shown in FIG. 9. An area to be enlarged (enlargement area) in a chip 31 is set using the user I/F 3, and the enlargement area is enlarged by an enlargement factor change tool 33. Then, a superimpose display of a layout data (wiring pattern) 32 and an inspection data can be obtained. The high fatal rate defect extraction unit 11b sets a rectangular shape, ellipsoidal shape and circle which indicate defect existence areas on the position coordinates on the layout pattern, based on the position information of the defect. The high fatal rate defect extraction unit 11b can determine and display the fatal rate from a positional relation between the layout pattern and defect existence areas 35-38, based on the fatal rate determination information. In addition, by rewriting the fatal rate, for example, 80%, 40%, 5% and 2% being displayed, the fatal rate determination information DB 29 can be rewritten.

Figure 10A:
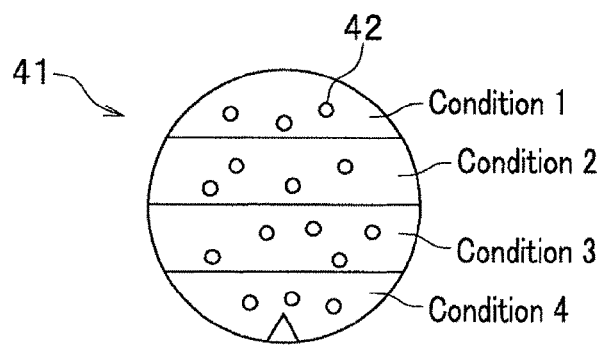
FIG. 10A is an illustration (First) showing one example of a detailed observation condition setting method for an observation target defect.
Figure 10B:
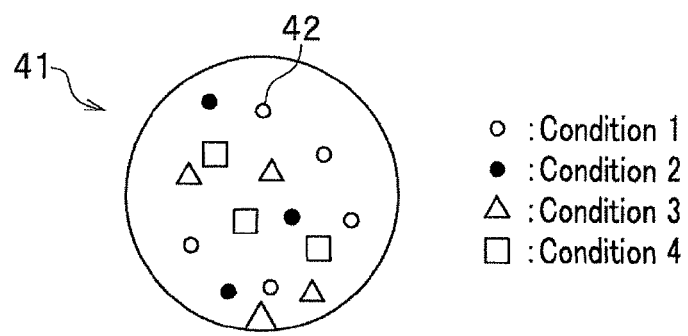
FIG. 10B is an illustration (Second) showing one example of the detailed observation condition setting method for the observation target defect.

Examples of a setting method of the detailed observation condition for an observation target defect are shown in FIG. 10A and FIG. 10B. An inspection that assigns each observation condition to all observation target defects 42 may be conducted. However, in order to shorten a processing time of the detailed observation process 9, as shown in FIG. 10A, an area of a wafer 41 may be divided by a number of observation condition, and a different inspection condition may be assigned to each of the divided areas. In addition, as shown in FIG. 10B, the inspection condition may be assigned randomly to the observation target defects 42 so that a number of the observation under each observation condition becomes equal, even if there is a tendency to be inhomogeneous in the distribution of the defects within the wafer 41.

EXPLANATION FOR REFERENCE NUMBER

1 Processing means
2 Storage means
3 User I/F
4 Inspection device
5 Detailed observation device
6 Communication line
7a, 7b Fabrication processes
8 Inspection process
9 Detailed observation process (Inspection process)
10 Observation condition determination support device
11 Observation target defect extraction means
12 Defect classification means
13 Classification result summary means
14 Classification result display means
15 Detailed observation condition determination/registration means
16 Detailed observation conduction check means
17 Detailed observation condition readout means
21 Inspection data DB (database)
22 Detailed observation condition DB
23 Layout data DB
24 Detailed observation target data DB
25 Classification teaching data DB
26 Detailed observation result DB of detailed observation condition
26 Observation target defect extraction condition DE 28
29 Fatal rate determination information DB
30 Detailed observation result summary data DB
31 Chip
32 Wiring pattern
33 Enlargement factor change tool
34 Enlargement area
35, 36, 37, 38 Defect existing area
41 Wafer
42 Observation target defects

What is claimed is:

1. An observation condition determination support device, comprising:
    means for acquiring a plurality of defect images of a same defect photographed under a plurality of observation conditions set in advance in an observation device, based on an inspection data of the same defect of a semiconductor device detected by an inspection device;
    means for determining a first category to which the same defect belongs for each of the plurality of the observation conditions as a result of classification, by classifying a plurality of the same defects based on each of the defect images; and
    means for determining the observation condition to be used when the semiconductor device is fabricated from the plurality of the observation conditions, based on a rate that the first category is matched with a second category which is determined by a user of the observation device by classifying the same defects.

2. The observation condition determination support device according to claim 1, further comprising:
    means for displaying a list of the second category and the first category corresponding to each of the plurality of the observation conditions, for each of the same defects.

3. The observation condition determination support device according to claim 1, further comprising:
    means for displaying a list of a plurality of the defect images of the same defect photographed under the plurality of the observation conditions, for each of the same defects.

4. The observation condition determination support device according to claim 3,
    wherein the means for displaying a list of a plurality of the defect images displays a list of a plurality of the defect images and requires input of the second category determined by the user.

5. The observation condition determination support device according to claim 1,
    wherein the means for acquiring a plurality of defect images skips acquisition of the defect images of a defect on a coordinate identical to the coordinate of the defect detected by an inspection process before a preceding inspection process.

6. The observation condition determination support device according to claim 1,
    wherein the means for acquiring a plurality of defect images determines a rate that the semiconductor device becomes defective by the defect by using a layout data of the semiconductor device, and based on the rate, extracts the defect as a defect for acquiring the defect images.

7. The observation condition determination support device according to claim 1,
    wherein the means for acquiring a plurality of defect images classifies the defect based on a distribution of the defect within a wafer which is formed by coordinates of a plurality of the defects, and extracts the defect from the classified defects as a defect for acquiring the defect images.

8. The observation condition determination support device according to claim 1, further comprising:
    means for extracting a defect whose first category is not matched with the second category; and
    means for requiring input for changing the first category or the second category, while displaying together the defect images of defects having a category identical to the first category of the extracted defect and the defect images of defects having a category identical to the second category of the extracted defect.

9. An observation condition determination support method, in which a computer executes steps of:
    acquiring a plurality of defect images of a same defect photographed under a plurality of observation conditions set in advance in an observation device, based on an inspection data of the same defect of a semiconductor device detected by an inspection device;
    determining a first category to which the same defect belongs for each of the plurality of the observation conditions as a result of classifying, by classifying a plurality of the same defects based on each of the defect images; and
    determining the observation condition to be used when the semiconductor device is fabricated from the plurality of the observation conditions, based on a rate that the first category is matched with a second category which is determined by the user of the observation device by classifying the same defects.

10. The observation condition determination support method according to claim 9, further comprising a step of:
    displaying a list of the second category and the first category corresponding to each of the plurality of the observation conditions, for each of the same defects.

11. The observation condition determination support method according to claim 9, further comprising a step of:

displaying a list of the plurality of the defect images of the same defect photographed under the plurality of the observation conditions, for each of the same defects.

12. The observation condition determination support method according to claim 11,
wherein in the displaying a list of the plurality of the defect images,
displaying a list of a plurality of the defect images; and
requiring input of the second category determined by the user.

13. The observation condition determination support method according to claim 9,
wherein in the acquiring a plurality of defect images,
skipping acquisition of the defect images of a defect on a coordinate identical to the coordinate of the defect detected by an inspection process before a preceding inspection process.

14. The observation condition determination support method according to claim 9,
wherein in the acquiring a plurality of defect images,
determining a rate that the semiconductor device becomes defective by the defect by using a layout data of the semiconductor device; and based on the rate, extracting the defect as a defect for acquiring the defect images.

15. The observation condition determination support method according to claim 9,
wherein in the acquiring a plurality of defect images,
classifying the defect based on a distribution of the defect within a wafer which is formed by coordinates of a plurality of defects; and
extracting the defect from the classified defects as a defect for acquiring the defect images.

16. The observation condition determination support method according to claim 9, further comprising steps of:
extracting a defect whose first category is not matched with the second category; and
requiring input for changing the first category or the second category, while displaying together the defect images of defects having a category identical to the first category of the extracted defect and the defect images of the defects having a category identical to the second category of the extracted defect together.

* * * * *